(12) United States Patent
Yohannes et al.

(10) Patent No.: US 11,508,896 B1
(45) Date of Patent: Nov. 22, 2022

(54) MATERIALS AND METHODS FOR FABRICATING SUPERCONDUCTING QUANTUM INTEGRATED CIRCUITS

(71) Applicant: SeeQC, Inc.

(72) Inventors: Daniel Yohannes, Stamford, CT (US); Mario Renzullo, Yonkers, NY (US); John Vivalda, Pleasantville, NY (US); Alexander Kirichenko, Pleasantville, NY (US)

(73) Assignee: Seeqc, inc., Elmsford, NY (US)

( * ) Notice: Subject to any disclaimer, the term of this patent is extended or adjusted under 35 U.S.C. 154(b) by 0 days.

(21) Appl. No.: 17/337,394

(22) Filed: Jun. 2, 2021

(51) Int. Cl.
  *H01L 39/22* (2006.01)
  *H01L 39/24* (2006.01)
  *G06N 10/00* (2022.01)
  *H01L 39/02* (2006.01)

(52) U.S. Cl.
  CPC ......... *H01L 39/223* (2013.01); *G06N 10/00* (2019.01); *H01L 39/025* (2013.01); *H01L 39/2406* (2013.01); *H01L 39/2461* (2013.01); *H01L 39/2493* (2013.01)

(58) Field of Classification Search
  CPC . H01L 39/223; H01L 39/025; H01L 39/2406; H01L 39/2461; H01L 39/2493; H01L 27/18; G06N 10/00
  See application file for complete search history.

(56) References Cited

U.S. PATENT DOCUMENTS

2020/0018803 A1* 1/2020 Lemay ................. A61B 5/0522

* cited by examiner

*Primary Examiner* — Matthew L Reames
(74) *Attorney, Agent, or Firm* — Hoffberg & Associates; Steven M. Hoffberg

(57) ABSTRACT

Materials and methods are disclosed for fabricating superconducting integrated circuits for quantum computing at millikelvin temperatures, comprising both quantum circuits and classical control circuits, which may be located on the same integrated circuit or on different chips of a multi-chip module. The materials may include components that reduce defect densities and increase quantum coherence times. Multilayer fabrication techniques provide low-power and a path to large scale computing systems. An integrated circuit system for quantum computing is provided, comprising: a substrate; a kinetic inductance layer having a kinetic inductance of at least 5 pH/square; a plurality of stacked planarized superconducting layers and intervening insulating layers, formed into a plurality of Josephson junctions having a critical current of less than 100 $\mu A/\mu m^2$; and a resistive layer that remains non-superconducting at a temperature below 1 K, configured to damp the plurality of Josephson junctions.

21 Claims, 9 Drawing Sheets

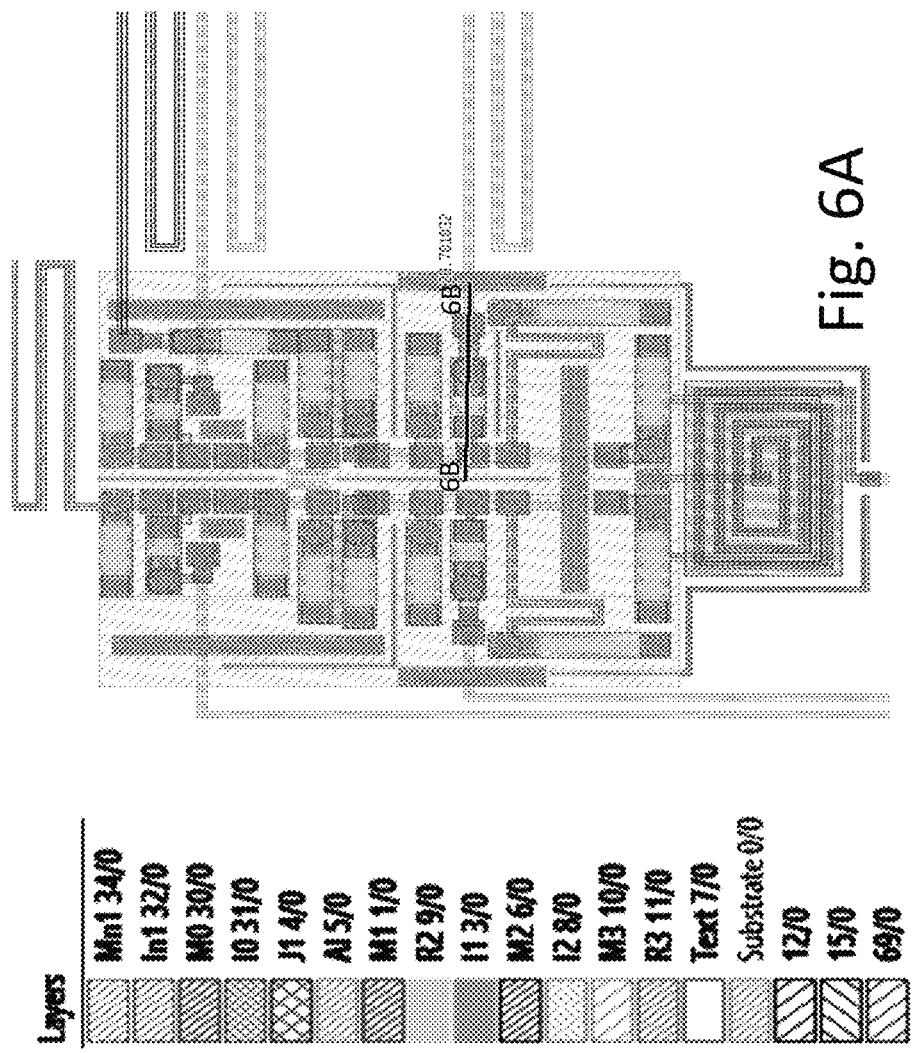
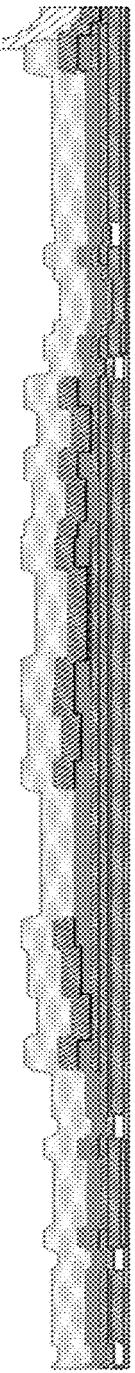
Fig. 6A
Fig. 6B

MATERIALS AND METHODS FOR FABRICATING SUPERCONDUCTING QUANTUM INTEGRATED CIRCUITS

CROSS REFERENCE TO RELATED APPLICATIONS

The present application is a non-provisional of, and claims benefit of priority from, U.S. Provisional Patent Application No. 63/034,367, filed Jun. 3, 2020, the entirety of which is expressly incorporated herein by reference in its entirety.

FIELD OF THE INVENTION

The present invention relates to the field of fabrication of superconducting integrated circuits, and more particularly to fabrication of superconducting integrated circuits for application to quantum computing.

BACKGROUND OF THE INVENTION

Each reference cited herein is expressly incorporated herein by reference in its entirety for all purposes.

Superconducting integrated circuits (ICs) based on Josephson junctions (JJs) are capable of operation with very low power and high speed, orders of magnitude beyond those possible using conventional semiconducting circuits. Techniques have been developed that permit fabrication of superconducting ICs with many thousands of JJs, including a plurality of superconducting wiring layers and vias connecting them. These have found application in circuits and systems for classical computing (i.e., performing primitive mathematical and logic operations), including those based on single-flux-quantum (SFQ) voltage pulses. These have generally been based on the superconductor niobium (Nb), and JJs based on Nb/AlOx/Nb tunnel junctions, with a barrier layer of aluminum oxide on the 1-nm scale.

See, for example, "Double-Masking Technique for Increasing Fabrication Yield in Superconducting Electronics" (U.S. Pat. Nos. 7,615,385; 8,383,426; 9,136,457; 9,595,656; 10,109,673); "System and Method for Providing Multi-Conductive Layer Metallic Interconnects for Superconducting Integrated Circuits" (U.S. Pat. Nos. 8,301,214; 8,437,818; 9,130,116; 9,741,920); and "Method for increasing the integration level of superconducting electronic circuits" (U.S. Pat. Nos. 9,741,918; 10,283,694).

Similar circuits may be integrated on the same chip as cryogenic magnetic memory cells ("System and methods for cryogenic hybrid technology computing and memory"; U.S. Pat. No. 10,460,796), superconducting photon detectors ("Integrated Superconducting Nanowire Digital Photon Detector" Ser. No. 16/016,149; "Superconducting optical-to-digital converter" Ser. No. 16/149,910), or ultra-low dissipation power distribution circuits ("Low-power biasing networks for superconducting integrated circuits"; U.S. Pat. No. 9,853,645).

Similar high-speed superconducting integrated circuits may be fabricated on a plurality of chips configured on a multi-chip module (MCM). See, for example, "Superconducting multi-chip module for high-speed digital circuits" (U.S. Pat. Nos. 8,937,255; 9,647,194); "Method of forming an electronic multichip module" (U.S. Pat. No. 8,804,358); "Method for electrically interconnecting at least two substrates and multi-chip module" (U.S. Pat. No. 10,373,928); "System and method for superconducting multichip module" (US 2020/011,925).

U.S. Pat. No. 10,403,808 provides a superconducting wafer stack, with insulators and dielectrics.

In recent years, new applications have been developing for superconducting integrated circuits in the field of quantum computing. These are also generally based on Josephson junctions, although materials and devices with reduced loss may be necessary to operate at extremely low (mK) temperatures. See, for example, "Systems and methods for fabrication of superconducting integrated circuits" (U.S. Pat. No. 9,978,809); "Method of forming superconducting apparatus including superconducting layers and traces" (U.S. Pat. No. 10,651,362); "Microwave integrated quantum circuits with vias and methods for making the same" (U.S. Pat. No. 9,971,970); "Chips including classical and quantum computing processors" (US 2017/0177534).

Conventional superconducting electronic design rules are optimized for operation at around 4 K. It is known that cooling capacities are small at low temperatures, tending to scale with T or even more strongly. For example, a semiconductor chip at room temperature may dissipate 1 W or more, while superconducting chips at 4 K can have power levels of a few mW. However, superconducting quantum circuits tend to operate at temperatures of order 10 mK (0.01 K), where power levels should be restricted to a few microwatts (µW).

Several techniques have been developed in the prior art to reduce power dissipation in superconducting circuits. In conventional RSFQ circuits, most of the power dissipation is associated with resistors in the power distribution network. In an alternative biasing scheme (known as EERSFQ or eSFQ), resistors are replaced by Josephson junctions and inductors, but large inductors may be difficult to integrate into the design scheme.

A further concern for quantum circuits is the need to maintain quantum coherence for relatively long times, which requires reducing defects and fluctuations in insulating layers near the active devices, as well as in the devices themselves. For example, amorphous materials such as silicon dioxide ($SiO_2$) may have atomic defects, and atomic hydrogen may diffuse into tunnel barriers of niobium Josephson junctions.

While some of these issues have been addressed in circuits with just a few superconducting quantum bits (qubits), practical quantum computers will require circuits with thousands of physical qubits. Furthermore, for efficient control and input/output, these quantum circuits should be interfaced with a similar number of classical superconducting circuits at the same temperature. This scaling has not yet been consistently demonstrated.

What is needed are methods of fabricating and packaging superconducting integrated circuits and systems, which retain the compatibility with design tools and scaling of classical superconducting circuits, while enhancing the performance of quantum and hybrid quantum/classical circuits at ultralow mK temperatures.

Quantum computing entails coherently processing quantum information stored in the qubits of a quantum computer. In certain types of quantum computing processors, such as quantum annealers or gate-based quantum processors, the qubits of the quantum processor are coupled together in a controllable manner such that the quantum state of each qubit affects the corresponding quantum states of the other qubits to which it is coupled.

In quantum computers that use qubits formed from superconductor materials, atomic-level defects characterized as two-level systems may reduce the quantum coherence of the qubits. Such two level systems are typically found on the surfaces and interfaces of the materials used to fabricate the qubits and other components of the computers. The fabrication of superconducting integrated circuits must be done in a way that minimizes the number of these defects located near the qubits.

To expand the number of qubits available for coupling in a solid state quantum processor, such as a quantum computer having superconducting quantum devices, one approach is to construct the quantum devices within the processor using 3D integration. That is, instead of fabricating the qubits and other quantum devices of the processor within a single plane that extends along one and/or two dimensions (e.g., x- and/or y-directions), the quantum devices can also be formed in one or more layers extending into a third dimension (e.g., z-direction). 3D integration also allows, in certain implementations, for greater connectivity and increases in quality factors associated with resonator devices. Moreover, 3D integration can, in some cases, provide a substantial reduction of crosstalk, since multiple layers of ground planes can be used to isolate drivelines and undesired coupling to other qubits, among other sources of cross-talk.

Embodiments of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

See, U.S. Published Application and Patent Nos. 20210148947; 20210134880; 20210133385; 20210125096; 20210119101; 20210110291; 20210091062; 20210083168; 20210073667; 20210057631; 20210057630; 20210036206; 20210035005; 20210033683; 20210028345; 20210021245; 20210013391; 20210011082; 20200401922; 20200401649; 20200380396; 20200379768; 20200362384; 20200350880; 20200350709; 20200335550; 20200321509; 20200321508; 20200320426; 20200293486; 20200287122; 20200287119; 20200280317; 20200279186; 20200279013; 20200274050; 20200264213; 20200264130; 20200257644; 20200250570; 20200250569; 20200250567; 20200242503; 20200235277; 20200194654; 20200184364; 20200183768; 20200167684; 20200167683; 20200152854; 20200152853; 20200127186; 20200125625; 20200119254; 20200119251; 20200111944; 20200111016; 20200091396; 20200083424; 20200075834; 20200075833; 20200075832; 20200064412; 20200052183; 20200052182; 20200050961; 20200019068; 20200006421; 20190392344; 20190391214; 20190385088; 20190369171; 20190363239; 20190363128; 20190348595; 20190326501; 20190324941; 20190317978; 20190305206; 20190305038; 20190305037; 20190296743; 20190296214; 20190296213; 20190296212; 20190296210; 20190288176; 20190273198; 20190273197; 20190273196; 20190266508; 20190245132; 20190237648; 20190236476; 20190228332; 20190228331; 20190214971; 20190214561; 20190188597; 20190182995; 20190165246; 20190165245; 20190165244; 20190165243; 20190165241; 20190165239; 20190165238; 20190164959; 20190164077; 20190156238; 20190137891; 20190131944; 20190131511; 20190109273; 20190087385; 20190074801; 20190065981; 20190051810; 20190044044; 20190042967; 20190042963; 20190042962; 20190019098; 20190013463; 20190006284; 20180373996; 20180365587; 20180358538; 20180358537; 20180348310; 20180342663; 20180337792; 20180337790; 20180337322; 20180336153; 20180335683; 20180331274; 20180323364; 20180322408; 20180314970; 20180308896; 20180301613; 20180301612; 20180300286; 20180294815; 20180287041; 20180285761; 20180285760; 20180277733; 20180276550; 20180267933; 20180261752; 20180260729; 20180248104; 20180247974; 20180246848; 20180240034; 20180219150; 20180211158; 20180198427; 20180196780; 20180138987; 20180137428; 20180107092; 20180102470; 20180102469; 20180101787; 20180101786; 20180101785; 20180091143; 20180091142; 20180091141; 20180091115; 20180033944; 20180026633; 20180013052; 20180012932; 20170373044; 20170359072; 20170329883; 20170317262; 20170300827; 20170300454; 20170286859; 20170255872; 20170229633; 20170229632; 20170229631; 20170228483; 20170212860; 20170201222; 20170177534; 20170170813; 20170170812; 20170162778; 20170133576; 20170133336; 20170116159; 20170104695; 20170098682; 20170093381; 20170092834; 20170091650; 20170091648; 20170091647; 20170089961; 20170077382; 20170072504; 20170071082; 20170062107; 20170039481; 20170017894; 20170017742; 20160335559; 20160335558; 20160314407; 20160233860; 20160191060; 20160132785; 20160112031; 20160093420; 20160087599; 20160079968; 20160071021; 20160065693; 20160040288; 20160019468; 20160012347; 20150349780; 20150346291; 20150332164; 20150269124; 20150263736; 20150262073; 20150241481; 20150187840; 20150119252; 20150111754; 20150046681; 20150032994; 20150032993; 20150032991; 20150028970; 20140368234; 20140357493; 20140344322; 20140329687; 20140314419; 20140264285; 20140246763; 20140235450; 20140229722; 20140229705; 20140113828; 20140097405; 20130278283; 20130119351; 20130043945; 20130015885; 20130009677; 20130007087; 20130005580; 20120326130; 20120094838; 20110298489; 20110253906; 20110175062; 20110133770; 20110089405; 20110065585; 20110047201; 20110022820; 20110018612; 20110010412; 20100306142; 20100194466; 20100148853; 20100085827; 20090322374; 20090289638; 20090261319; 20090192041; 20090167342; 20090082209; 20090078932; 20090075825; 20090057652; 20080086438; 20080052055; 20070194225; 20070180586; 20070174227; 20070080341; 20060248618; 20060225165; 20060147154; 20060097747; 20060097746; 20050256007; 20050250651; 20050224784; 20050162302; 20050101489; 20050098773; 20050082519; 20050045872; 20050001209; 20040238813; 20040173793; 20040173792; 20040173787; 20040170047; 20040167036; 20040165454; 20040140537; 20040098443; 20040095803; 20040077503; 20040016918; 20040012407; 20030224944; 20030207766; 20030193097; 20030173997; 20030173498; 20030169041; 20030146430; 20030146429;

20030121028; 20030111661; 20030111659; 20030107033; 20030102470; 20030098455; 20030094606; 20030071258; 20030057441; 20030042481; 20030038285; 20020188578; 20020179939; 20020179937; 20020177529; 20020121636; 20020117738; 20020117656; Ser. Nos. 11/010,683; 11/005,022; 11/004,896; U.S. Pat. Nos. 10,998,869; 10,991,755; 10,989,767; 10,985,701; 10,984,336; 10,978,631; 10,976,671; 10,969,443; 10,958,274; 10,950,778; 10,950,299; 10,949,769; 10,943,180; 10,938,128; 10,937,941; 10,922,381; 10,917,096; 10,903,411; 10,900,998; 10,891,554; 10,886,454; 10,884,033; 10,873,302; 10,852,366; 10,847,705; 10,840,296; 10,833,879; 10,833,243; 10,833,242; 10,833,239; 10,826,713; 10,819,281; 10,817,463; 10,812,073; 10,803,396; 10,797,684; 10,790,433; 10,789,329; 10,784,432; 10,769,546; 10,763,420; 10,756,712; 10,749,096; 10,749,095; 10,748,961; 10,748,960; 10,748,079; 10,741,744; 10,734,569; 10,720,563; 10,719,776; 10,714,672; 10,707,873; 10,707,402; 10,707,401; 10,700,257; 10,700,256; 10,693,566; 10,691,633; 10,686,115; 10,672,971; 10,671,559; 10,658,424; 10,657,455; 10,657,198; 10,650,320; 10,644,217; 10,637,479; 10,628,753; 10,628,752; 10,621,140; 10,615,783; 10,608,157; 10,593,879; 10,593,871; 10,586,911; 10,586,909; 10,573,800; 10,560,103; 10,553,775; 10,552,757; 10,552,755; 10,546,993; 10,540,603; 10,535,013; 10,529,907; 10,528,887; 10,528,886; 10,510,943; 10,503,077; 10,497,746; 10,491,178; 10,489,477; 10,488,469; 10,475,983; 10,467,545; 10,461,445; 10,460,796; 10,454,015; 10,453,894; 10,424,713; 10,418,540; 10,404,214; 10,403,809; 10,396,269; 10,396,268; 10,389,336; 10,381,541; 10,380,494; 10,367,134; 10,367,133; 10,366,340; 10,361,354; 10,355,677; 10,355,193; 10,353,844; 10,346,508; 10,346,349; 10,345,678; 10,340,438; 10,339,239; 10,333,047; 10,333,046; 10,318,880; 10,291,227; 10,290,798; 10,276,772; 10,276,771; 10,268,968; 10,256,392; 10,243,132; 10,242,968; 10,236,432; 10,235,635; 10,235,634; 10,230,038; 10,229,366; 10,210,460; 10,199,553; 10,177,297; 10,176,432; 10,171,077; 10,170,681; 10,170,680; 10,164,606; 10,147,865; 10,141,928; 10,140,404; 10,140,248; 10,134,972; 10,133,985; 10,127,500; 10,121,754; 10,108,071; 10,097,186; 10,074,793; 10,074,792; 10,068,180; 10,062,829; 10,062,828; 10,056,885; 10,056,540; 10,050,630; 10,042,805; 10,037,493; 10,031,887; 10,014,859; 10,002,107; 9,998,122; 9,994,956; 9,985,614; 9,978,809; 9,978,020; 9,966,926; 9,953,268; 9,948,254; 9,935,252; 9,929,978; 9,928,948; 9,923,538; 9,922,289; 9,917,580; 9,913,414; 9,887,000; 9,881,256; 9,875,444; 9,870,536; 9,865,648; 9,858,532; 9,853,645; 9,843,312; 9,818,064; 9,812,836; 9,806,711; 9,799,817; 9,787,312; 9,787,278; 9,780,765; 9,780,764; 9,779,360; 9,768,771; 9,768,371; 9,767,238; 9,755,133; 9,741,920; 9,735,776; 9,727,823; 9,727,527; 9,710,758; 9,699,266; 9,697,473; 9,692,423; 9,685,935; 9,680,452; 9,647,662; 9,646,259; 9,588,940; 9,547,826; 9,520,180; 9,509,280; 9,509,274; 9,503,063; 9,495,644; 9,490,296; 9,473,124; 9,455,391; 9,454,061; 9,444,430; 9,438,246; 9,432,024; 9,424,526; 9,406,026; 9,385,293; 9,369,133; 9,355,362; 9,350,460; 9,344,092; 9,335,385; 9,240,773; 9,183,508; 9,178,154; 9,170,278; 9,130,116; 9,129,224; 9,069,928; 9,059,674; 8,975,912; 8,951,808; 8,928,391; 8,872,360; 8,861,619; 8,854,074; 8,812,066; 8,786,476; 8,772,759; 8,686,751; 8,670,807; 8,571,614; 8,560,282; 8,536,566; 8,508,280; 8,504,497; 8,437,818; 8,437,168; 8,421,053; 8,386,554; 8,301,214; 8,294,138; 8,284,585; 8,283,293; 8,174,305; 8,138,784; 8,102,185; 8,098,179; 8,008,942; 7,977,668; 7,969,805; 7,969,178; 7,932,514; 7,898,282; 7,880,529; 7,868,645; 7,863,892; 7,852,106; 7,847,615; 7,844,656; 7,788,192; 7,786,748; 7,782,077; 7,772,871; 7,724,020; 7,639,035; 7,624,088; 7,619,437; 7,613,765; 7,613,764; 7,533,068; 7,418,283; 7,364,923; 7,335,909; 7,332,738; 7,268,576; 7,253,654; 7,230,266; 7,135,701; 7,042,005; 7,015,499; 7,002,174; 6,987,282; 6,984,846; 6,979,836; 6,960,780; 6,943,368; 6,936,841; 6,930,320; 6,930,318; 6,919,579; 6,911,664; 6,905,887; 6,900,456; 6,900,454; 6,897,468; 6,885,325; 6,838,694; 6,822,255; 6,812,484; 6,803,599; 6,791,109; 6,784,451; 6,753,546; 6,728,131; 6,670,630; 6,649,929; 6,627,916; 6,627,915; 6,614,047; 6,605,822; 6,580,102; 6,576,951; 6,573,202; 6,563,311; 6,563,310; 6,537,847; 6,504,172; 6,495,854; and 6,459,097, each of which is expressly incorporated herein by reference in its entirety.

SUMMARY OF THE INVENTION

In order to meet the requirements of designing superconducting quantum and classical circuits to operate at mK temperatures with reduced dissipation and increased coherence times, the following improvements over standard design rules for classical superconducting circuits at 4 K have been made.

1) Reduced-Loss Insulating Layers

In prior-art superconducting integrated circuit processes, there are multiple (e.g., 4) superconducting wiring layers with insulating layers between them. In a preferred embodiment, the insulating layers are changed from silicon dioxide ($SiO_2$) as used in the prior art to silicon nitride ($SiN_x$). The silicon nitride films (produced by plasma enhanced chemical vapor deposition) are believed to have fewer defects and permit longer coherence times than $SiO_2$. Furthermore, insulating layers near a qubit are removed to the extent possible, even layers on a classical control circuit that may be bump-bonded to the qubit. In a still further modification, even the native silicon dioxide on the silicon wafer substrate is removed before depositing the metals. This might in principle permit conduction through the substrate, except that the semiconducting substrate is virtually insulating and has virtually no carriers at the ultralow temperatures.

2) Josephson Junctions with Reduced Critical Current

The standard superconducting electronic process permits Nb/AlOx/Nb Josephson junctions on submicron scales. The standard minimum critical current in Josephson junctions for circuits optimized for operating at 4.2 K is about 100 µA, in order to avoid effects of thermal fluctuations. For circuits operating at 40 mK, the critical current can be reduced to as low as about 1 µA, which dramatically reduces power dissipation per junction. For this reason, in the revised integrated circuit fabrication process, the critical current density Jc of the Josephson junctions (determined by the thickness of the tunnel barrier) is reduced to 1 kA/cm² (10 µA/µm²), as compared with the previous standard process with Jc=20 kA/cm². For a junction with area ~0.1 µm², this yields Ic~1 µA.

3) Kinetic Inductive Layer

Superconducting integrated circuits require lossless inductances, which are generally produced by superconducting transmission line structures. A typical circuit inductance may be as large as L~$\Phi_0$/Ic, where $\Phi_0$=2 mA-pH (picoHenrys) is the magnetic flux quantum. For Ic~1 µA, this requires L~2000 pH, which is quite large on the µm scale. Inductances for low-power current distribution can be even larger. In order to properly design these large inductors, an additional superconducting wiring layer is added, based on ultrathin NbN films. These NbN films exhibit extra "kinetic inductance" not associated with a magnetic field, corresponding to a film thickness d much less than the relatively large superconducting penetration depth of NbN. For films ~40 nm thick, the kinetic inductance is of order 10 pH/square. This enables the design of inductors that are considerably more compact than would otherwise be required for these low-Ic superconducting circuits. In a preferred process presented herein, the high-kinetic-inductance layer is placed below the Nb ground plane, as the first layer (MN1) on top of the silicon wafer.

4) Resistive Layer

Superconducting electronic circuits require a resistive layer, for use in damping Josephson junctions and in current distribution networks. While inductors may be substituted for resistors in biasing networks, shunt resistors for the junctions are still needed for classical single-flux-quantum (SFQ) circuits at ultralow temperatures. The standard resistive layer in prior classical superconducting circuits was the metal molybdenum (Mo), which however becomes superconducting (and therefore non-resistive) at temperatures below about 1 K. For this revised quantum-compatible process, the resistive layer comprises a 40 nm layer of PdAu, which remains non-superconducting down to the mK range. This may also incorporate very thin Ti adhesion layers (Ti/PdAu/Ti), but this remains resistive with a resistance of about 2 ohms/square.

5) Superconducting Bump Bonds

In a preferred embodiment, superconducting qubit chips may be mounted on top of a carrier (multi-chip module or MCM) comprising superconducting control circuits (or vice versa). It is preferred that the bump act as a zero-resistance electrical connection between the two circuits, which can transmit SFQ pulses from the control circuit to the quantum circuit, and also maintain a small fixed spacing between the two circuits. Following the prior art, one preferred embodiment of the bump bonds comprises the combination of micron-scale copper posts and indium adhesive bonds. Below a temperature of 3.4 K, the indium is superconducting, so that these bonds have the necessary superconducting properties for operation at mK temperatures.

6) Planarized Layers

To increase the reliability of a scalable multilayer process for fabricating superconducting integrated circuits, we have developed a custom wafer-scale planarization process, based on chemical-mechanical polishing, which is compatible with the new silicon nitride dielectric layers. This does not damage the superconducting layers or Josephson junctions. This is described further below.

7) Reducing Hydrogen Contamination Effects

It is well known that hydrogen ions (protons) diffuse easily through transition metals such as Nb. Furthermore, it is believed that hydrogen atoms may alter the properties of Nb Josephson junctions by their presence in or near the tunnel barrier, introducing variability and noise. One way to address this in the prior art (U.S. Pat. No. 8,301,214) is to insert hydrogen diffusion barrier layers at several key steps in the process. Similar diffusion barriers may be incorporated into the current improved process. A complementary approach is to deliberately introduce deuterium atoms (heavy hydrogen) at a key step in the process. The heavier deuterium atom has a reduced diffusion constant, but also has a different nuclear spin that may exhibit reduced noise properties, potentially contributing to enhanced quantum coherence times. It is suggested that deuterium may be incorporated into the process by the use of deuterated carrier gases such as silane and hexamethyldisilazane (HMDS).

These are a few of the many improved materials and methods that may be used to improve the performance, reproducibility, and scaling of superconducting circuits for quantum computing. A preferred embodiment of the invention may include any or a combination or subcombination of these, or others that follow the same general approach of reducing power, enhancing quantum coherence, and promoting scaling for superconducting circuits at ultralow temperatures.

It is therefore an object to provide an integrated circuit system for quantum computing, comprising: a substrate; a kinetic inductance layer having a kinetic inductance of at least 5 pH/square; a plurality of planarized superconducting layers and intervening insulating layers, the insulating layers, formed into a plurality of Josephson junctions having a critical current density of less than 100 $\mu A/\mu m^2$; and a resistive layer that remains non-superconducting at a temperature below 1 K, configured to damp the plurality of Josephson junctions. The substrate may be silicon. The insulating layers may be a nitride, e.g., silicon nitride.

It is also an object to provide a method of forming an integrated circuit system for quantum computing, comprising: providing a substrate; forming a kinetic inductance layer having a kinetic inductance of at least 5 pH/square; depositing a plurality of superconducting layers and intervening insulating layers, the insulating layers comprising silicon nitride; patterning the plurality of superconducting layers and intervening insulating layers into Josephson junctions having a critical current density of less than 100 $\mu A/\mu m^2$; planarizing the plurality of superconducting layers and intervening insulating layers; and forming a resistive layer that remains non-superconducting at a temperature below 1 K, to damp the Josephson junctions.

It is a further object to provide a superconducting integrated circuit adapted to operate at a temperature below 0.5 K, comprising: a kinetic inductance layer having a kinetic inductance of at least 5 pH/square, patterned into at least one inductor; a planarized plurality of superconducting layers and intervening insulating layers configured to galvanically isolate the superconducting layers, formed into a plurality of submicron Josephson junctions having a critical current density of less than 100 $\mu A/\mu m^2$; and a resistive layer that remains non-superconducting at a temperature of 0.5 K, configured into a resistive shunt for damping a Josephson junction.

Another object provides a method of forming an integrated circuit on a substrate, adapted to operate at a temperature below 0.5 K, comprising: forming and patterning a kinetic inductance layer having a kinetic inductance of at least 5 pH/square; depositing a plurality of superconducting layers and intervening insulating layers, at least one insulating layer being planarized; patterning the plurality of superconducting layers and intervening insulating layers into Josephson junctions having a critical current density of less than 100 $\mu A/\mu m^2$; and forming a resistive layer that remains non-superconducting at a temperature of 0.5 K, to damp the Josephson junctions.

The integrated circuit system may comprise a plurality of interconnected substrates, Wherein the respective substrates are aligned with each other to provide selective galvanic contact. The substrates are bonded, for example by indium copper bumps, or cryogenic adhesive, such as suitable epoxies. The substrate functionality may be partitioned, such that some substrates comprise Josephson junction-based classical computing devices and other comprise qubits, or the functions may be disperse across the same substrates. A plurality of superconducting qubits on one substrate may therefore be coupled to a classical superconducting circuit comprising at least one of the plurality of Josephson junctions on another substrate.

The opposed substrates may have protruding posts and corresponding trenches to assure precision alignment therebetween. Enhanced planarity may be achieved by use of copper pedestals which mate with a planarized surface of the mating chip.

The superconducting integrated circuit may be adapted to operate, and be operated, at a temperature below 100 mK, 50 mK or 10 mK, and the resistive layer remains non-superconducting at a corresponding temperature of 100 mK, 50 mK, or 10 mK. The resistive layer may comprise a 40 nm layer of PdAu.

The superconducting integrated circuit may be formed on a silicon substrate. The silicon substrate may have an oxide-free interface to a superconducting layer, and is preferably cleared of the oxide layer before deposition of a metal layer on it, e.g., the oxide layer is removed.

At least one insulating layer may comprise silicon nitride. Each insulating layer may comprise silicon nitride. Each insulating layer may consist essentially of silicon nitride. The intervening insulating layers may be configured to galvanically isolate the superconducting layers.

The kinetic inductance layer may have a kinetic inductance of at least 8 pH/square, e.g., about 10 pH/square.

The kinetic inductance layer may be patterned as an inductor. The kinetic inductance layer may comprise a meander inductor. The kinetic inductance layer may be patterned into a current distribution network.

The plurality of Josephson junctions may have a critical current density of less than 50 $\mu A/\mu m^2$, e.g., about 10 $\mu A/\mu m^2$.

A bump bond comprising indium may be provided for joining the substrate to another circuit. The bump bond may comprise a micron-scale copper post and indium adhesive bond.

The integrated circuit may comprise deuterium diffused into the Josephson junction. The plurality of planarized superconducting layers and intervening insulating layers, or the superconducting integrated circuit, may comprise at least one hydrogen diffusion stop layer. The integrated circuit system may further comprise at least one hydrogen diffusion stop layer. The integrated circuit system may further comprise deuterium diffused into a transition metal layer. The method may further comprise diffusing deuterium into the Josephson junction and/or a transition metal layer, and/or fabricating the integrated circuit with a deuterated reagent. At least one hydrogen diffusion stop layer may be formed.

It is also an object to provide an integrated circuit system for quantum computing, comprising: a substrate which is non-superconducting at a temperature below 1 K; a kinetic inductance layer, formed over the substrate, having a kinetic inductance of at least 5 pH/square; a plurality of stacked planarized superconducting layers and intervening insulating layers, formed over the kinetic inductance layer, and patterned into a plurality of Josephson junctions having a critical current of less than 100 $\mu A/\mu m^2$; and a patterned resistive layer, that remains non-superconducting at a temperature below 1 K, formed over the plurality of stacked planarized superconducting layers and intervening insulating layers, and being configured to form Josephson junction damping elements for damping the plurality of Josephson junctions.

The superconducting integrated circuit may be configured as a control chip for generating single flux quantum pulses, for controlling a superconducting qubit on a different chip, both the superconducting integrated circuit and the superconducting qubit on a different chip operating at the same temperature. The superconducting integrated circuit may generate single flux quantum (SFQ) pulses. The SFQ pulses may control a superconducting qubit integrated circuit. The integrated circuit and the superconducting qubit integrated circuit may be on different chips, with both the superconducting integrated circuit and the superconducting qubit integrated circuit operating at the same temperature.

BRIEF DESCRIPTION OF THE DRAWINGS

FIG. 6A shows a top view of an exemplary circuit of section of a control chip.

FIG. 6B shows a cross section across line 6B-6B of a portion of the control chip.

DETAILED DESCRIPTION OF THE PREFERRED EMBODIMENTS

Figure 1:
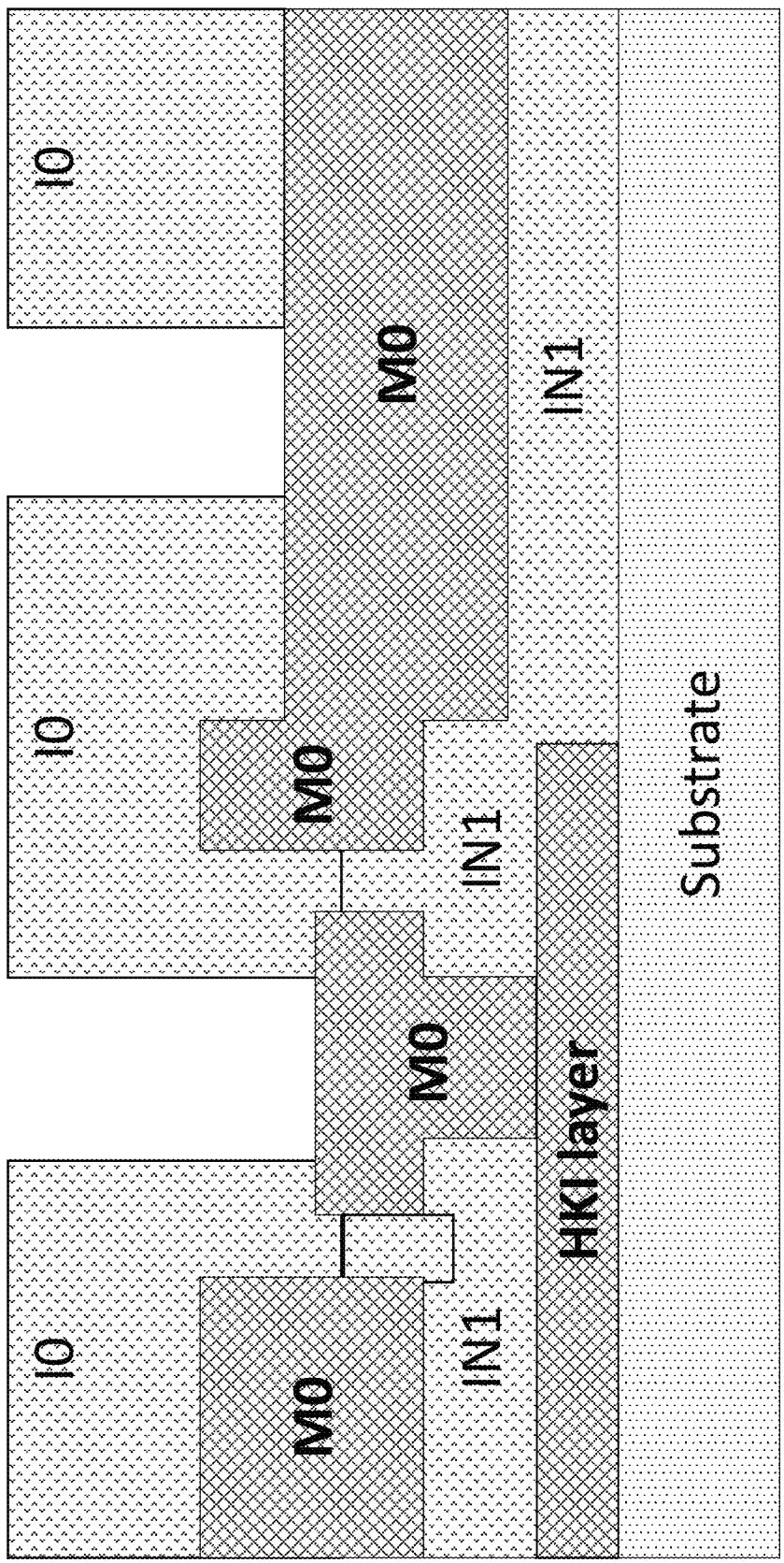
FIG. 1 shows a cross-sectional view of a High Kinetic Inductance Layer.

FIG. 1 shows a cross-sectional view of the lowest layers of wiring on the silicon substrate. The vertical dimensions are not necessarily to scale, and the horizontal dimensions here are arbitrary.

The silicon substrate is a high-resistance silicon wafer (typically 15 cm in diameter), with the native oxide removed. Note the presence of a patterned High-Kinetic Inductance (HKI) layer directly on the substrate, comprising a NbNx superconducting film with a kinetic inductance here of 8.5 pH/square. This is also called the MN1 layer, for metal nitride. This might be used as an inductor in a memory loop or a bias line, for example. The M0 layer is the superconducting ground plane, which could be Nb or NbN.

The IN1 layer is the low-loss silicon nitride insulator layer that separates MN1 from M0, unless a via is needed to connect the two wiring layers. Silicon nitride is also used for the I0 layer above M0. The I0 layer is planarized (using a form of chemical-mechanical polishing or CMP) to form a flat substrate for a subsequent Josephson junction layer.

Figure 2:
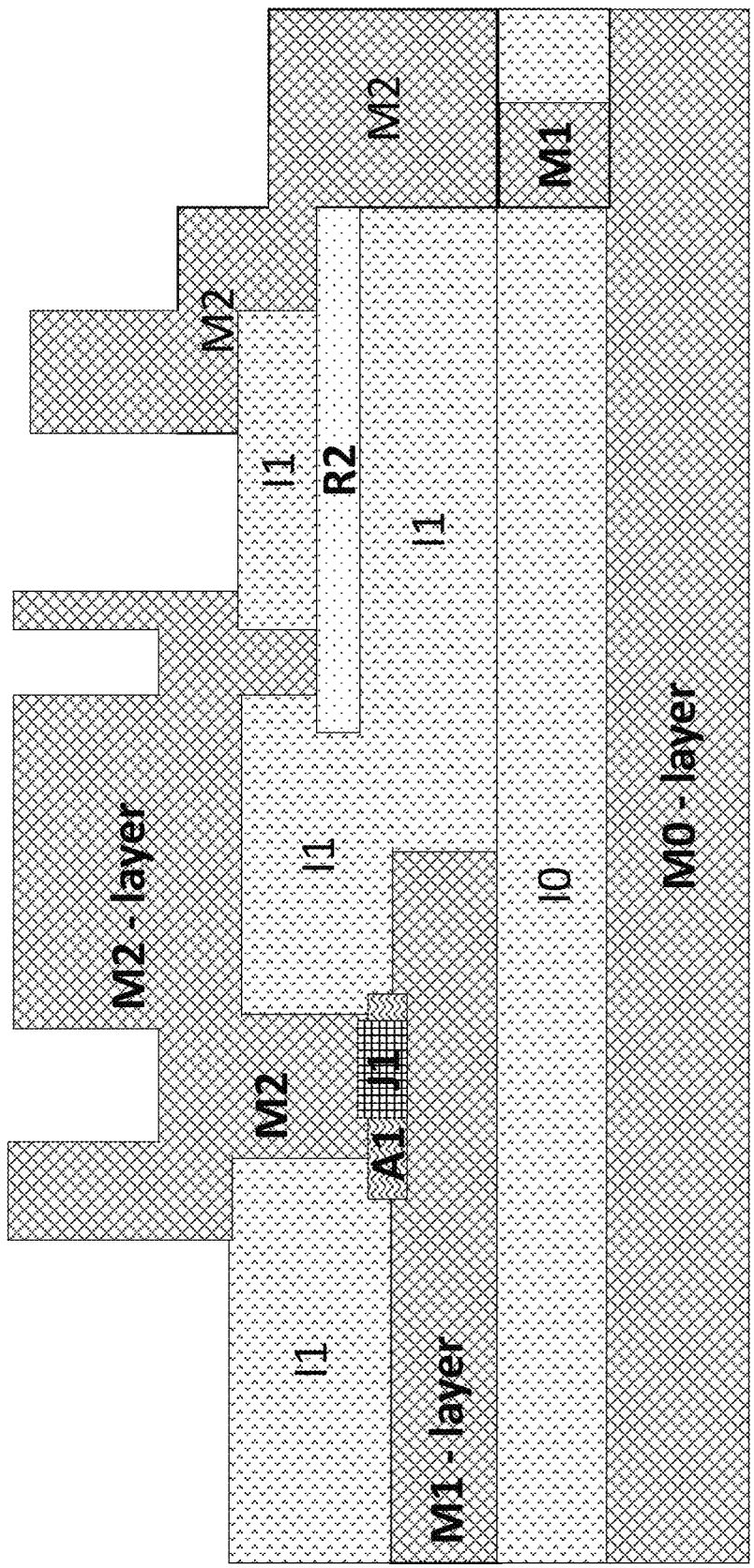
FIG. 2 shows a cross-sectional view of a Josephson Junction layer.

FIG. 2 shows a cross-sectional view of the middle layers of the superconducting IC, focusing on the Josephson junction. This is labeled J1, and lies between Nb wiring layers M1 and M2, with the junction area defined with an anodization ring A1 around the junction. The junction layer itself comprises a trilayer with Nb base and counter-electrode, and a very thin layer of Al which is mostly oxidized to form the tunnel barrier between the two Nb layers. The critical current density of the junction is designed to be Jc=1 kA/cm$^2$ (10 $\mu A/\mu m^2$) in the relevant mK regime. The R2 layer is the resistor layer, here comprising a Pd—Au alloy film with a resistance 4 ohms/square down to the mK range. Note that here the R2 layer provides a resistive shunt for the Josephson junction, which critically damps the junction so that it may generate a picosecond SFQ voltage pulse. Layers M1 and M2 are 135 and 300 nm thick, respectively.

Figure 3:
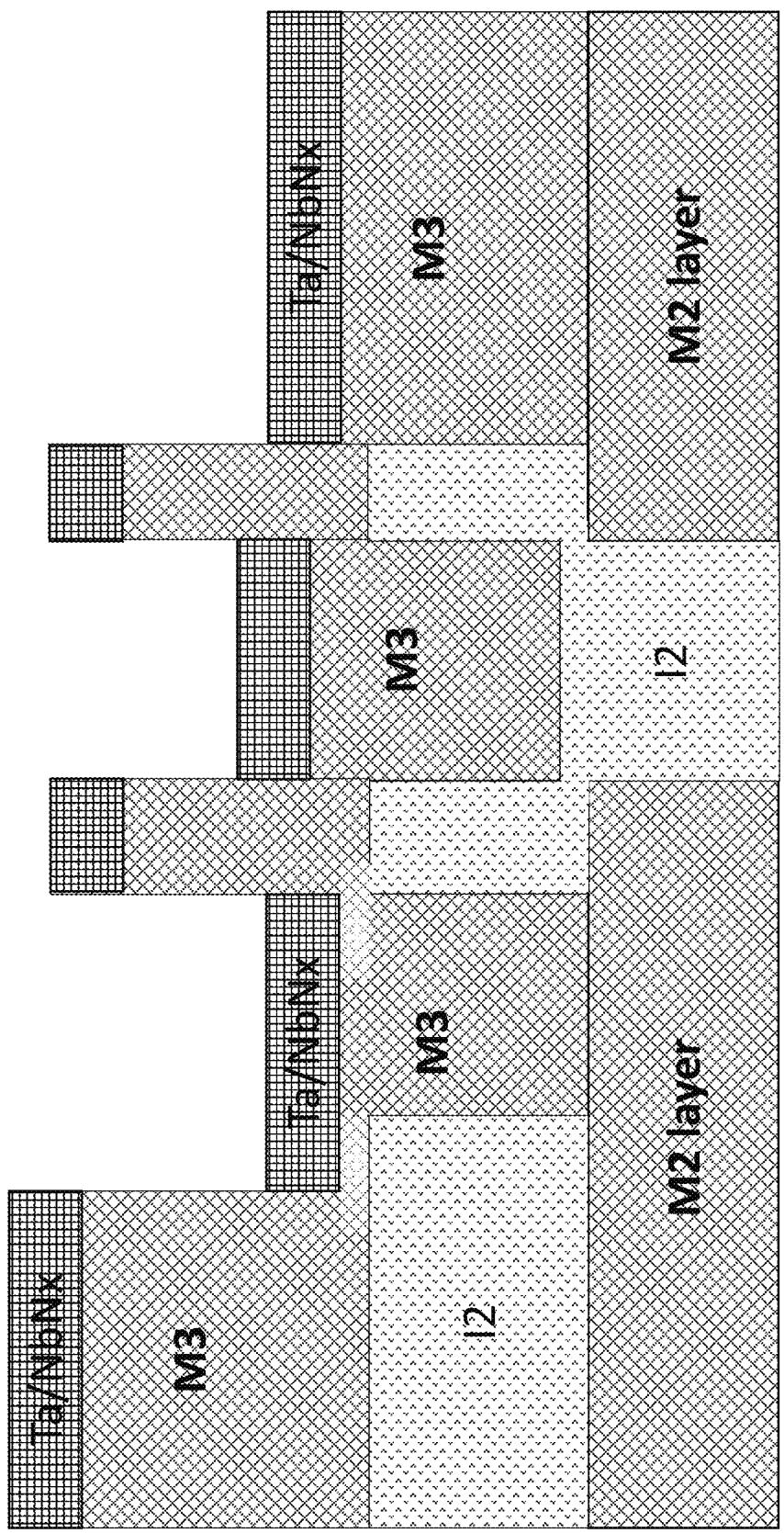
FIG. 3 shows a cross-sectional view of a top ground layer.

FIG. 3 shows the cross section of the top layers of the superconducting circuit, including a 500 nm thick M3 layer of Nb, with a 100 nm top capping layer of Ta or NbNx. I2 is the silicon nitride insulating layer separating M2 from M3. The M3 layer may be a tantalum layer, or a niobium layer capped with tantalum, which forms a thinner native oxide layer than niobium.

Figure 4A:
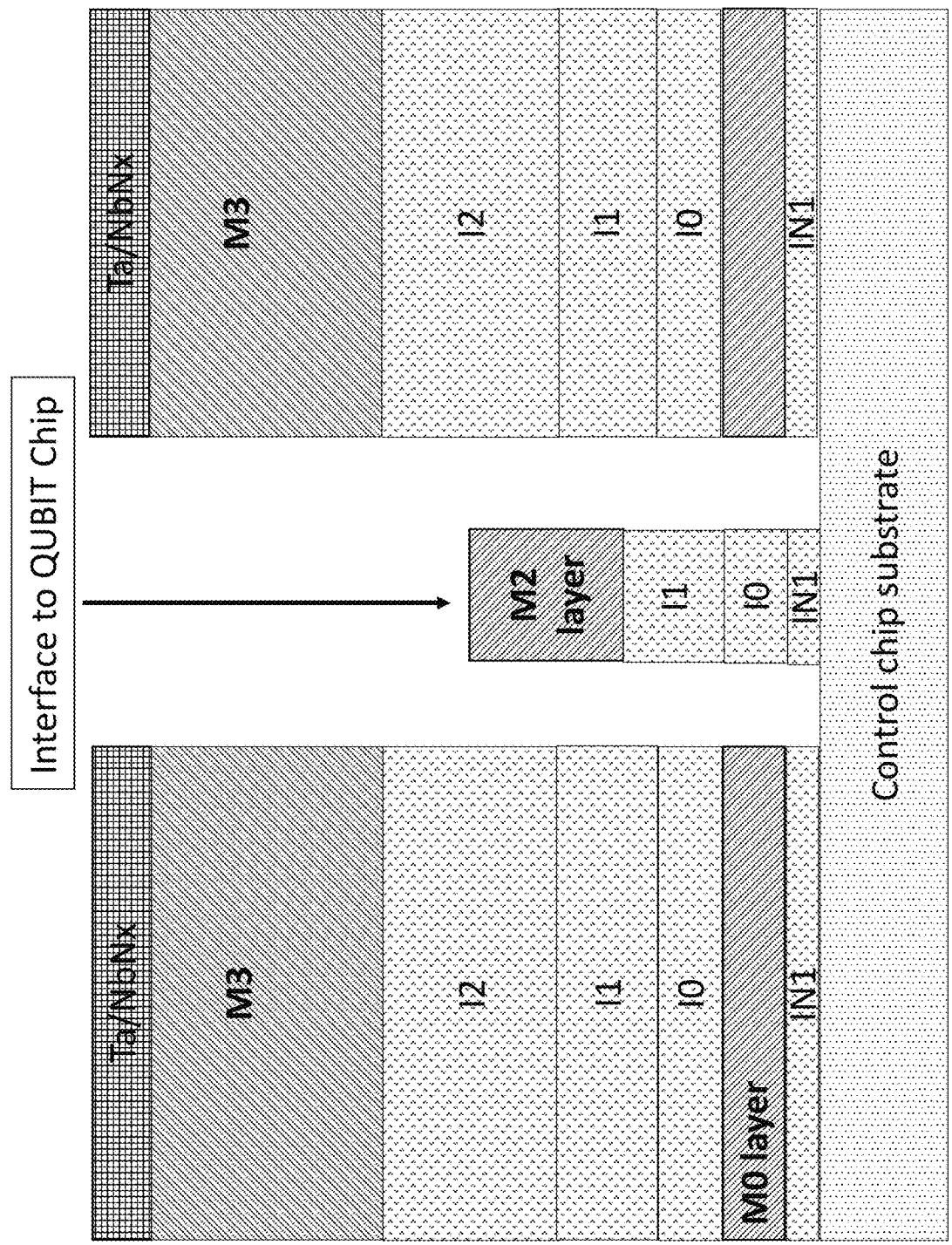
FIG. 4A shows a cross-sectional view of a control chip near a qubit chip.
Figure 4B:
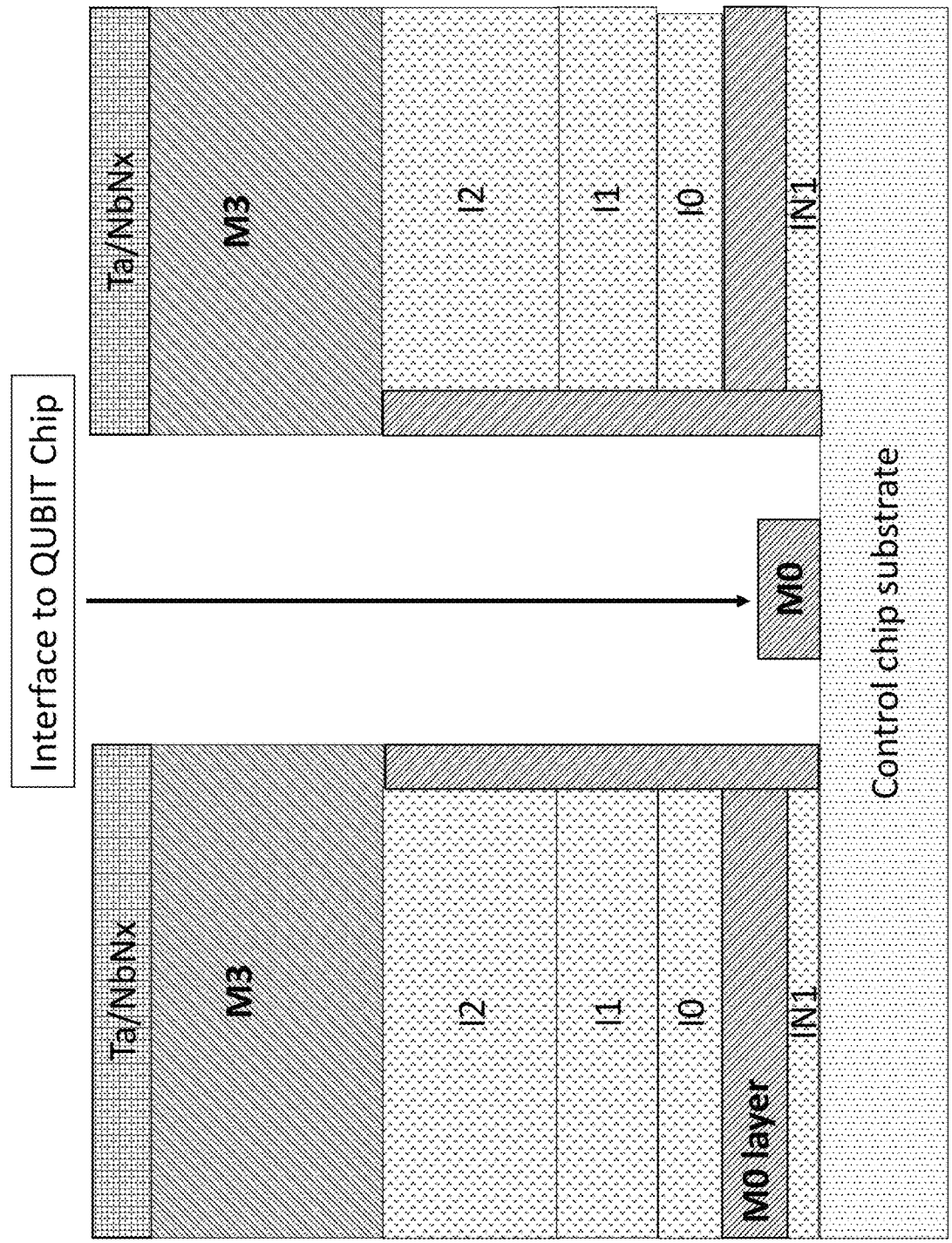
FIG. 4B shows a cross-sectional view of a control chip near the qubit chip, with lowered participation ratio than that shown in FIG. 4A.
Figure 5:
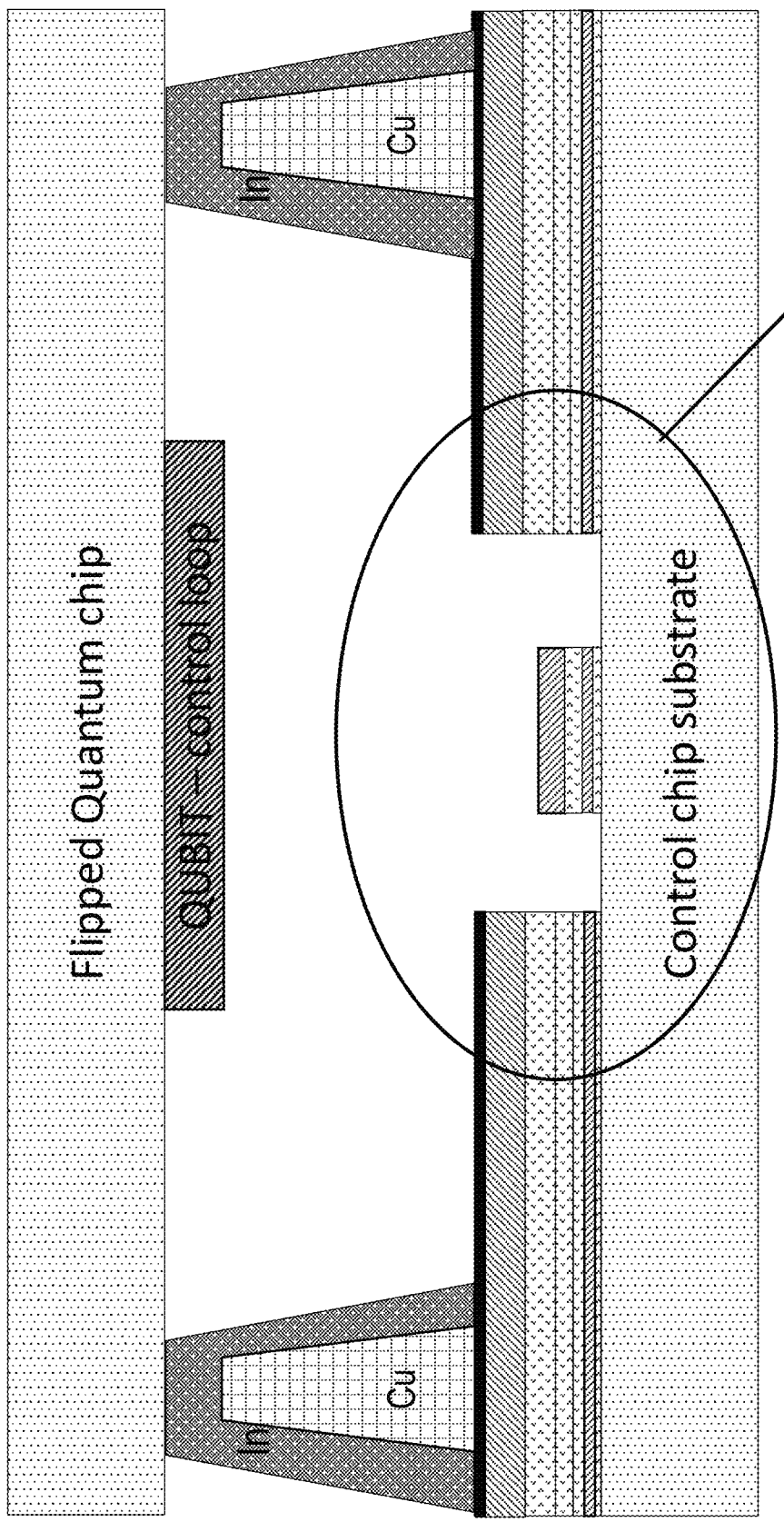
FIG. 5 shows a cross-sectional view of a control chip bonded to a qubit chip.

FIG. 4A shows the cross-section of the patterned control chip, with a section etched away where it would be close to a qubit chip. FIG. 4B shows a cross-section of the patterned control chip, with a section etched away where it would be close to a qubit chip, having a lowered participation ratio. The flip-chip assembly is shown in FIG. 5, where the qubit control loop is shown on top. FIG. 4A is a detail of FIG. 5, as indicated. It may be inductively coupled to SFQ pulses from the control chip below. Note the spacing between the two chips provided by the 5 μm Cu posts and Indium pressed bumps, where the indium provides a superconducting link between the two chips at the mK operating temperature.

FIG. 6A shows a top view and FIG. 6B shows a corresponding cross-section for a section of a superconducting circuit of a control chip along section 6B-6B, showing multiple Josephson junctions, shunt resistors, inductors, and bias lines.

Figure 7A:
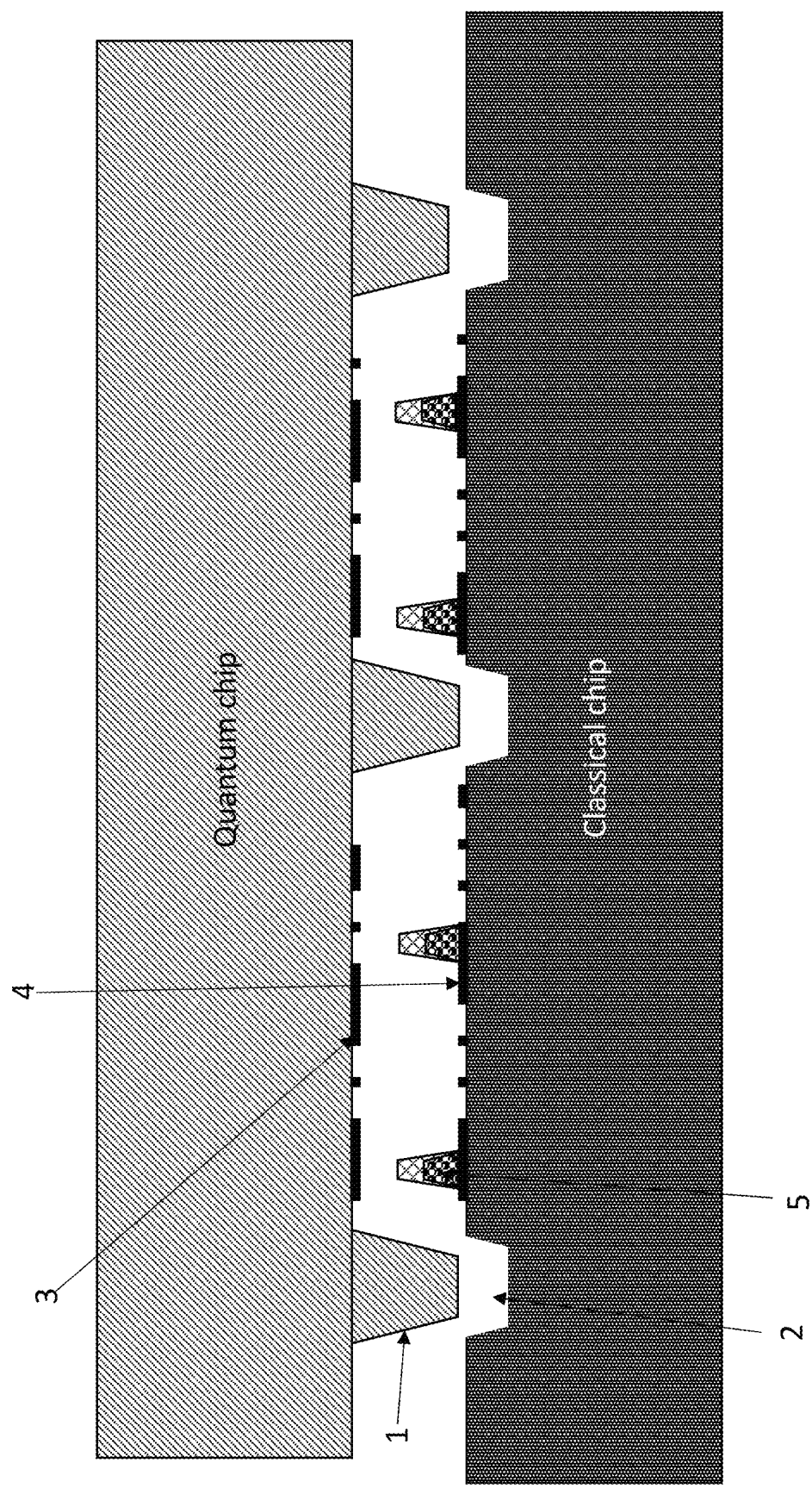
FIG. 7A shows a quantum chip and control chip aligned using mating post and trench technology.

FIG. 7A shows a first embodiment of how precision alignment may be assured between the control chip 4 (digital logic) and the quantum chip 3 (qubits). Known anisotropic silicon wafer etching techniques using chlorine-based etches may be used to create silicon posts 1 on the quantum chip and matching silicon trenches 2 on the control chip. The interlocking pairs can be strategically placed around the two chips to minimize the tilt between the two chips. The resulting micron-scale alignment can be used both for galvanic electrical contact (via the Cu/In bumps 5) and non-contact capacitive and inductive coupling between the classical control chip and the quantum chip.

Figure 7B:
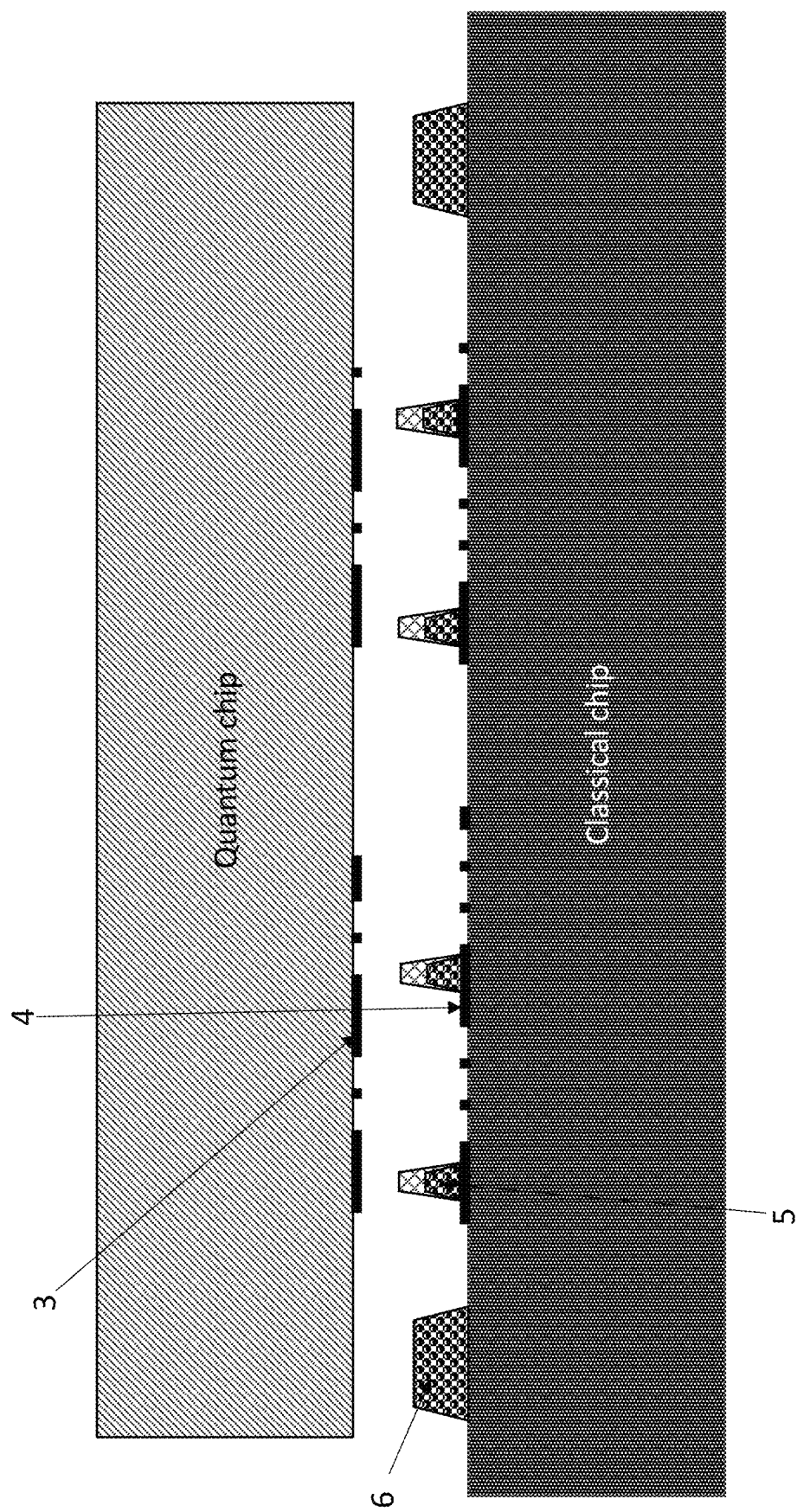
FIG. 7B shows a quantum chip and control chip with copper pedestals aligned using mating post and trench technology.

FIG. 7B shows a second embodiment which employs a copper pedestal for improved planarity with respect to the embodiment of FIG. 7A. While the control chip 4 (digital logic) and the quantum chip 3 (qubits) are not self-aligned, the copper pedestals can be planarized to ensure that the surfaces are parallel.

The indium on the bumps is superconductive at the operating temperatures of the device, below 3.4 K, and make contact with a superconducting surface of the adjacent chip. In some cases, the adjacent chip surface is subject to oxidation or otherwise needs protection, and advantageously, a thin gold film may be formed on top of a superconducting surface, which itself will be induced into superconductivity under operating conditions.

A) Exemplary Design Rules for Superconducting Quantum Control Circuit Electronics Fabrication: Process #QC1000A 1.0 General Description 1.1 This integrated circuit fabrication process uses only refractory materials, with the exception of a Pd/Au metallization layer used for contact pads. Niobium is used as the superconducting material due to its comparably high critical temperature, electrical and thermal stability, and ability to be thermally cycled many times without degradation. Niobium/Aluminum-Oxide/Niobium Josephson tunnel junctions are made by depositing an in-situ trilayer across the entire wafer and subsequently defining junction areas by deep-UV photolithography and etching. This method yields good uniformity and reproducibility of junction parameters.

1.2 The critical current density of Nb/AlO$_x$/Nb trilayer associated with QC1000A is 1 kA/cm$^2$ (10 μA/μm$^2$).

1.3 The Josephson junctions can be interconnected into circuit configurations using four superconducting layers: junction base electrode (layer M1), two Nb wiring layers (layers M2 and M3), superconducting NbNx ground plane (layer M0) and a NbNx high kinetic inductance layer below the ground plane (MN1)

1.4 The sheet resistance of the resistive layer (R2) is a Ti/PdAu/Ti resistive material with sheet resistance of 2.0 ohms/sq and a thickness of 100±10 nm.

1.5 Low loss SiNx is deposited to provide insulation between the conducting layers. Anodization of the base electrode of trilayer provides additional insulation to Josephson junctions.

1.6 QC1000A is fabricated on a 150-mm diameter (6-inch) high resistivity Si wafer.

1.7 QC1000A Process Flow Overview is shown in the table below.

| # | Layer | GDS # | Mask polarity | Description |
|---|---|---|---|---|
| 1 | MN1 | 34 | + | Al/NbNx deposition<br>MN1 layer patterning<br>Low loss SiN$_x$ deposition |
| 2 | IN1 | 32 | − | Contact (via) between MN1 and M0 patterning<br>NbNx deposition |
| 3 | M0 | 30 | − | M0 patterning (holes in niobium ground plane)<br>Low loss SiN$_x$ deposition<br>CMP "Caldera" planarization |
| 4 | I0 | 31 | − | Contact (via) between M1 and ground plane patterning<br>Nb/Al/AlO$_x$/Nb trilayer deposition (see 1.2) |
| 5 | J1 | 4 | + | Counter-electrode (junction area) definition<br>Base electrode anodization |
| 6 | A1 | 5 | + | Anodization layer patterning |
| 7 | M1 | 1 | + | Trilayer base electrode patterning<br>Low loss SiN$_x$ deposition |
| 8 | R2 | 9 | + | Resistive layer patterning<br>Resistive layer deposition (see 1.4)<br>Low loss SiN$_x$ deposition |
| 9 | I1 | 3 | − | Contact (via) between M2 and (J1/J2, R2, or M1)<br>Nb deposition |
| 10 | M2 | 6 | + | M2 layer patterning<br>Low loss SiN$_x$ deposition |
| 11 | I2 | 8 | − | Contact (via) between M2 and M3<br>Nb deposition |
| 12 | M3 | 10 | + | M3 layer patterning |
| 13 | I3 | 13 | − | I3 (Dielectric removal from Qubit interface) patterning |
| 14 | R3 | 11 | + | Contact pad patterning<br>Pd/Au contact metallization deposition |
| 15 | BMP-Cu | 12 | + | "bump" layer for MCM, Copper |
| 16 | BMP-In | 15 | + | "bump" layer for MCM, Indium |

Layout Design Rules 2.1 Minimal size, spacing, and surround for each layer are specified in the following table:

| # | Layer | Rule | μm | Comment |
|---|---|---|---|---|
| 1 | MN1 | Positive | | MN1 wiring layer |
| 1.1 | | MN1 minimal size | 0.8 | |
| 1.2 | | MN1 minimal spacing | 1.0 | |
| 1.3 | | MN1 surround IN1 | 0.3 | |
| 2 | IN1 | Negative | | Contact (via) between MN1 and M0 |
| 2.1 | | IN1 minimal size | 0.8 | |
| 2.2 | | IN1 surrounded by MN1 | 0.3 | |
| 2.3 | | IN1 spacing to M0 | 0.3 | A via should always be covered with metal. M0 is a negative layer, -"spacing" instead of "surrounded by" |
| 2.4 | | IN1 edge spacing to J1 | 0.5 | Crossing IN1 pattern with JJs is possible but not recommended |
| 3 | M0 | Negative | | Holes in ground plane |
| 3.1 | | M0 minimal size | 0.5 | |
| 3.2 | | M0 minimal spacing | 0.5 | |
| 3.3 | | M0 spacing to I0 | 0.3 | A hole in insulation should always be over metal. M0 is a negative layer, - so, the rule is "spacing to". |
| 4 | I0 | Negative | | Contact (via) between M1 and ground plane |
| 4.1 | | I0 minimal size | 1.0 | |
| 4.2 | | I0 spacing to J1 | 1.0 | J1 patterns should not overlap with I0 patterns. A hole in insulation layer must be completely covered by two adjacent metal layers (from top and bottom) |
| 4.3 | | I0 surrounded by M1 | 0.3 | |
| 4.4 | | I0 edge spacing to R2 | 0.3 | |
| 5 | J1 | Positive | | Trilayer counter electrode (junction area) definition |
| 5.1 | | J1 minimal size | 0.6 | |
| 5.2 | | J1 minimal spacing | 1.0 | |
| 5.3 | | J1 surrounded by A1 | 0.5 | A JJ must be covered by anodization layer |
| 5.4 | | J1 surrounded by M1 | 1.0 | |
| 5.5 | | M0 edge spacing to J1 | 0.5 | |
| 5.6 | | I0 edge spacing to J1 | 1.0 | J1 patterns should not overlap with I0 patterns. |
| 5.7 | | IN1 edge spacing to J1 | 0.5 | Crossing J1 patterns with IN1 is not recommended. |
| 6 | A1 | Positive | | M1 anodization layer patterning |
| 6.1 | | A1 minimal size | 1.0 | |
| 6.2 | | A1 surrounded by M1 | 0.3 | |
| 6.3 | | A1 edge spacing to R2 | 0.3 | |
| 6.4 | | A1 edge spacing to I1 | 0.5 | If hole in I1 is surrounded by A1, no galvanic contact to M1 is possible (except for via JJ) |
| 7 | M1 | Positive | | Trilayer base electrode patterning |
| 7.1 | | M1 minimal size | 0.8 | |
| 7.2 | | M1 minimal spacing | 1.0 | |
| 7.3 | | M1 edge spacing to R2 | 0.3 | |
| 7.4 | | M1 surround I1[7] | 0.5 | |
| 8 | R2 | Positive | | Resistive layer patterning |
| 8.1 | | R2 minimal size | 0.8 | |
| 8.2 | | R2 minimal spacing | 1.0 | |
| 8.3 | | R2 surround I1 | 0.5 | A simultaneous contact to both R2 and M1 layers is possible. The overlap area of I1 hole with each layer (R2 and M1) should satisfy rule 8.1 |
| 8.4 | | M0, M1, I0, or A1 edge spacing to R2 | 0.3 | R2 pattern may not cover steps in I0, A1 or M1. Placing R2 object inside M0, I0, A1 or M1 area is allowed. |
| 9 | I1 | Negative | | Contact (via) between M2 and (J1/J2, R2, or M1) |
| 9.1 | | I1 minimal size | 1.0 | |
| 9.2 | | I1 surrounded by M2 | 0.5 | |
| 10 | M2 | Positive | | M2 wiring layer |
| 10.1 | | M2 minimal size | 0.8 | |
| 10.2 | | M2 minimal spacing | 1.0 | |
| 10.3 | | M2 surround I2 | 0.5 | |
| 11 | I2 | Negative | | Contact (via) between M2 and M3 |
| 11.1 | | I2 minimal size | 1.8 | |
| 11.2 | | I2 surrounded by M3 | 0.5 | |
| 12 | M3 | Positive | | M3 wiring layer |
| 12.1 | | M3 minimal size | 2.0 | |
| 12.2 | | M3 minimal spacing | 2.0 | |
| 12.3 | | M3 minimal contact with R3 | 5.0 | R3 layer is deposited directly on M3 (without insulation). To provide a reliable electrical contact between objects in R3 and M3 layers, the overlap should be no less than 5 microns. |
| 13 | I3 | Negative | | Di-electric removal from selected area |
| 13.1 | | I3 minimal size | 1.8 | |
| 13.2 | | I2 surrounded by M3 | 0.5 | |
| 14 | R3 | Negative | | Pd/Au contact metallization |
| 14.1 | | R3 minimal size | 5.0 | |
| 14.2 | | R3 minimal spacing | 3.0 | |
| 14.3 | | R3 surrounded by M3 | 0.5 | |

-continued

| # | Layer | Rule | μm | Comment |
|---|---|---|---|---|
| 15 | BMP1 | Negative | | Copper bumps layer for MCM |
| | 15.1 | BMP minimal size | 10 | |
| | 15.2 | BMP minimal spacing | 30 | |
| 16 | BMP2 | Negative | | Indium bumps layer for MCM |
| | 16.1 | BMP minimal size | 15 | |
| | 16.2 | BMP minimal spacing | 30 | |
| | 16.3 | BUM2 surround BNP1 | 2.5 | |

3.0 Physical Layer Process Specifications 3.1 Since the fabrication process involves projection photolithography and etching, the size of features (e.g., linewidth) on the wafer may systematically differ somewhat from the designed feature size. This change in size is called "bias". In the table below, the bias is defined as the shift of the object's edge due to its enlargement/reduction relative to its intended position in the design. It is often called single-side bias. A positive bias means that the digitized areas become larger on the wafer than in the design. The biases shown below for all layers, except J1/J2, are applicable to relatively extended objects with sizes larger that the minimal feature size for a given layer. In most cases, sharp corners will be rounded up.

3.2 Josephson junctions of circular shape are recommended. The deviation of the radius of the circle in J1 layer is within ±20 nm. If such a deviation is critical, use "digitized circular shape", i.e., a polygon with vertices of 135 degrees placed on 20-nm grid.

3.3 The $C_s$ is the specific capacitance in $fF/\mu m^2$ and $j_c$ is the critical current density in $\mu A/\mu m^2$, and plasma voltage in mV.

| $J_c$ ($\mu A/\mu m^2$) | 0.3 | 1.0 | 10.0 | 45.0 | 100.0 | 200.0 |
|---|---|---|---|---|---|---|
| $C_s$ ($fF/\mu m^2$) | 37 | 40 | 50 | 59 | 65 | 71 |
| $V_p$ ($\mu V$) | 52 | 91 | 257 | 501 | 711 | 962 |

| Layer | Material | Bias (3.1) μm | Physical layer properties: resistance, capacitance, etc. | Thickness nm |
|---|---|---|---|---|
| MN1 | $NbN_x$ | 0.0 ± 0.1 | Nb, superconductor. Penetration depth $\lambda_L$ = 250 nm ± 5% | 40 ± 4 |
| IN1 | $SiN_x$ | 0.0 ± 0.1 | $SiN_x$, insulator. Capacitance: 0.24 $fF/\mu m^2$ ± 20% | 75 ± 7 |
| M0 | $NbN_x$ | 0.0 ± 0.1 | Nb, superconductor. Penetration depth $\lambda_L$ = 250 nm ± 5% | 200 ± 10 |
| I0 | $SiN_x$ | 0.0 ± 0.1 | $SiN_x$, insulator. Capacitance: 0.31 $fF/\mu m^2$ ± 10% | 150 ± 15 |
| M1 | Nb | 0.0 ± 0.1 | Trilayer base electrode, superconductor. $\lambda_L$ = 100 nm ± 5% | 135 ± 10 |
| J1 | Nb | 0.0 ± 0.02 | Josephson tunnel junction counter electrode (see 3.2 and 3.3) | 50 ± 5 |
| A1 | $Nb_2O_5/Al_2O_3$ | 0.0 ± 0.1 | Layer of the anodized surface of base electrode (i.e., surrounding a Josephson junction). Capacitance: 5.0 $fF/\mu m^2$ ± 20% | 40 ± 5 |
| | $SiN_x$ | | $SiN_x$, insulator. Capacitance: 0.52 $fF/\mu m^2$ ± 10% | 100 ± 10 |
| R2 | Ti/PdAu/Ti | 0.0 ± 0.1 | 2.0 ± 0.2 Ohm per square | 40 ± 6 |
| | $SiN_x$ | | $SiN_x$, insulator. Capacitance: 0.52 $fF/\mu m^2$ ± 10% | 100 ± 10 |
| I1 | | 0.0 ± 0.1 | Contact hole through the above two $SiO_2$ layers | |
| M2 | Nb | −0.1 ± 0.05 | Nb, superconductor. Penetration depth $\lambda_L$ = 80 nm ± 5% | 300 ± 20 |
| | $SiN_x$ | | $SiN_x$ insulator. Capacitance: 0.08 $fF/\mu m^2$ ± 10% | 500 ± 40 |
| I2 | | 0.0 ± 0.1 | Contact hole through the above insulator | |
| M3 | Nb Capped with Ta/NbNx | −0.3 ± 0.1 | Nb, superconductor. Penetration depth: $\lambda_L$ = 80 nm ± 5% | 500 ± 50 / 100 ± 10 |
| I3 | | | di-electric removal | |
| R3 | Pd/Au | 0.0 ± 1.0 | Contact pads metallization | 350 ± 60 |
| BMP-Cu | Cu/Au | 0.0 ± 1.0 | Copper Layer for MCM bump | 6000 ± 600 |
| BMP-In | NbNx/In | 0.0 ± 1.0 | Indium Layer for MCM bump | 3000 ± 300 |

3.4 The critical current per micron width for superconducting films is given in the following table

|  | Nb Layer | | | | |
| --- | --- | --- | --- | --- | --- |
|  | MN1 | M0 | M1 | M2 | M3 |
| $I_c$ (mA/μm) | 2.5 | 20.0 | 30.0 | 50.0 | 70.0 |

If the wire crosses over steps, its $I_c$ may drop by more than 50%. The minimal width of a wire is shown in table 2.1 and its bias in table 3.0 before designing current transmitting lines.

3.5 The specific inductance of the superconducting films is given in the following table

|  | Layer | | | |
| --- | --- | --- | --- | --- |
|  | MN1-M0 | M0-M1-M3 | M0-M2-M3 | M0-M2 |
| Ls (pH/sq) | 8.50 | 0.40 | 0.38 | 0.63 |

| Lithography features | | |
| --- | --- | --- |
| Mask Grid Size Layer | Polarity | Grid Size [μm] |
| MN1 | Clear field | 0.1 |
| IN1 | Dark field | 0.1 |
| M0 | Dark field | 0.1 |
| I0 | Dark field | 0.1 |
| M1 | Clear field | 0.1 |
| J1 | Clear field | 0.02 |
| J2 | Clear field | 0.02 |
| A1 | Clear field | 0.1 |
| R2 | Clear field | 0.1 |
| I1 | Dark field | 0.1 |
| M2 | Clear field | 0.1 |
| I2 | Dark field | 0.1 |
| M3 | Clear field | 0.1 |
| I3 | Dark field | 0.1 |
| R3 | Dark field | 0.1 |
| BMP-Cu | Dark field | 0.1 |
| BMP-In | Dark field | 0.1 |

4.2 Layer J1 have grid size of 20 nm. All remaining layers must use grid size of 100 nm. Every pixel coordinate is rounded up to a multiple of grid.

4.3 All layouts will be printed on wafers as you see them on your computer screen (no mirroring).

5.0 Designs Submission Formats

The format of layout file is GDS-II. The active chip area for the design is limited to 5,000 μm×5,000 μm. On the wafer, it will be surrounded by a dicing channel. Dicing channels between chips are 150 μm wide. No objects are allowed inside a dicing channel (extending beyond the 5,000 μm×5,000 μm area). In the case of 1-cm chips, the design area is 10,150 μm×10,150 μm. No objects are allowed beyond the 10,150 μm×10,150 μm area.

B. Substitution of Deuterium for Hydrogen to Reduce Noise in Quantum Circuits

This provides a method of manufacturing quantum devices where deuterium is incorporated into the devices either as an additional component or as a replacement of light hydrogen within the molecules of the component materials of the integrated circuits in order to reduce quasiparticles and intrinsic losses.

A basic challenge towards the creation of qubits is developing devices whose quantum coherence lasts long enough to enable control and measurement with error rates below the bounds requisite for quantum error correction.

For example, lossy materials within the mode volume of superconducting resonant structures impose a limit on how long such systems can store energy. Reducing the participation ratio of energy-storing non-vacuum materials (inclusive of surfaces, interfaces, thin films, and bulk matter) within the mode volume increases this limit. In particular, two-level systems present at surfaces and interfaces of superconducting qubits are believed to be a significant source of decoherence. The substrate to metal interface and substrate to air interface are believed to be a source of loss.

Deuterium is an isotope of hydrogen with a nuclear spin=1, unlike hydrogen which has a spin=½. The manipulation of nuclear spin by radiofrequency waves is important in chemical spectroscopy and medical imaging. When placed in a magnetic field, active nuclei absorb electromagnetic radiation at a frequency characteristic to the isotope. The resonant frequency, energy of the radiation absorbed, and the intensity of the signal are proportional to the strength of the magnetic field. Such a signal, although beneficial for chemical spectroscopy and medical imaging is a potential source of quasiparticles and losses in quantum devices.

Deuterium is most commonly used in hydrogen nuclear magnetic resonance spectroscopy (proton-NMR). NMR ordinarily requires compounds of interest to be analyzed as dissolved in solution. Because of deuterium's nuclear spin properties which differ from the light hydrogen usually present in organic molecules, NMR spectra of hydrogen/protium are highly differentiable from that of deuterium, and in practice deuterium is not seen by an NMR instrument tuned for light hydrogen. Deuterated solvents (including heavy water, but also compounds like deuterated chloroform, $CDCl_3$) are therefore routinely used in NMR spectroscopy, in order to allow only the light hydrogen spectra of the compound of interest to be measured, without solvent signal interference.

Exemplary embodiments include a qubit system, including a substrate layer, where the substrate surface is treated with a deuterated hexamethyldisilane (HMDS) immediately prior to metal deposition to reduce losses associated with the metal-substrate interface.

Additional exemplary embodiments include a method of fabricating a qubit system, where a crystalline silicon layer is grown epitaxially on the substrate using a deuterated silane source gas. The deuterated silane may also consist of an isotopically pure silicon-28 isotope for the formation of spin silicon qubits.

Further exemplary embodiments include a method of fabricating a qubit system, where superconducting quantum circuits containing Josephson junctions are employed for qubits on a quantum device which is bonded as a multi-chip module (MCM) to a classical superconducting electronic control circuit. The classical superconducting electronic control circuit consists of deuterated dielectric materials as insulators (i.e., deuterated tetraethyl orthosilicate glass (TEOS), silicon nitride with a deuterium impurity) that may be formed by employing plasma enhanced chemical vapor deposition (PECVD) with deuterated source gases (i.e., deuterated silane, deuterated ammonia).

C. Chemical-Mechanical Polishing (CMP) for Very Large Scale Integration of Classical and Quantum Superconducting Electronic Integrated Circuits Conventionally, in the superconducting electronics field, a wiring pattern comprising a dense array of superconductive lines is formed by depositing a metal layer and etching to form a superconductive pattern. An insulating layer, typically formed of a dielectric material, is then applied to the wiring pattern and planarization of the dielectric material is achieved by chemical mechanical planarization.

Typically, the chemical mechanical planarization process for superconducting integrated circuits involves either planarizing the dielectric above or below the metal pattern without exposing the metal pattern, allowing for more wiring layers, but fails to provide stacked vias and high density VLSI chips. Another process, called the caldera process, also provides a planarized and exposed metal pattern. In the caldera process, the dielectric material is etched, exposing the metal pattern, then a silica-based slurry is utilized wherein the remaining dielectric material is planarized. The limitations of the caldera process are that it requires many processing steps, and has not yet been proven to provide stacked vias and other components on all microdevice layers. Currently, it is extremely difficult to planarize layers with both small and large structures while providing a highly uniform wafer surface, let alone in a reproducible manner while exposing a superconducting pattern.

According to a preferred embodiment, the surface of the integrated circuit is planarized in a pattern-independent manner comprising chemical-mechanical polishing, to selectively remove materials so as to leave an exposed Damascene pattern. Preferably, excess insulating material (e.g., silicon nitride) is removed from the metallic wiring. The conventional Damascene process is limited when the metal is removed at a low selectivity to the insulating material. When the metal removal rate is not selective enough to the insulating material, then the process severely erodes the insulator. The present approach addresses such a limitation, by enabling the use of a reverse Damascene process.

The reverse Damascene process also provides a planar surface with a wiring pattern embedded in an insulating layer. The embedded wiring pattern is formed by first etching a deposited metal or other conductive and/or superconductive material. Once the pattern is formed, a conformal insulating layer is deposited onto the patterned surface. The conformal insulating layer is chemically-mechanically polished to remove all insulator above the patterned layer. After polishing, the top surface of the patterned metallic, conductive and/or superconductive material is exposed but remains embedded in the insulating layer.

Currently, chemical-mechanical polishing (CMP) using a ceria-based slurry is adopted to achieve the formation of shallow trench isolation (STI) for element isolation in the manufacturing of semiconductor devices. STI is formed by providing a groove to a semiconductor substrate comprising a CMP stopper film, forming a silicon oxide film thereon, and removing the excess silicon oxide film by CMP. The stopper film is then removed in a subsequent processing step. Typically, the stopper film is a nitride such as silicon nitride.

According to the present technology, a novel application of silicon nitride and ceria-based slurries has been achieved, wherein the silicon nitride is the main dielectric used for insulation without the need for silicon oxide, and a stopper film is not required when either silicon oxide or silicon nitride dielectric insulation is used.

Alternatively, instead of ceria, other abrasives can be utilized such as silica or alumina. If the patterned metallic, conductive and/or superconductive material is a niobium-based material, then it is possible for a corrosive slurry to stop on the niobium-based material regardless of abrasive type.

Additives such as polymers, surfactants, inhibitors, and/or oxidizers may be added into the slurry for known purposes.

The superconductive material, dielectric material, slurry pH and abrasive type are not limited to the preferred embodiments.

The chemical-mechanical polishing may be performed in two or more steps rather than in one step provided in the preferred embodiment.

The polishing pad can be any of those which are conventionally employed in CMP, such as those comprising a cellular polyurethane pad. The polishing pad utilized in the preferred embodiment consists of a hard pad over a soft base pad. The hard pad consists of a cellular material while the soft base pad consists of a felt material.

The polishing parameters (i.e., slurry flow rate, downforce, table rotation) are optimized for maximum uniformity. The polishing parameters may also be set slightly above or below that of the preferred embodiment. The conditioning of the pad during CMP (i.e., in-situ or ex-situ) is preferred but not required.

The polishing process may be timed and calculated based on the rate of removal of the insulating material. The polishing process does not require the detection of an endpoint, through the use of metrology (i.e., ellipsometry, profilometry) or by any other means. Endpoint detection may also be employed. In addition, stopping the chemical-mechanical polishing process before the endpoint is reached and then reaching the endpoint in a second processing step (i.e., reactive ion etching, wet etching) is another embodiment.

Depositing a liner material (i.e., silicon nitride, tantalum nitride) as a stopping material over the metal, conductor and/or superconductor, to be later removed in a subsequent step is yet another embodiment.

These examples are not to be understood as limiting the invention, but rather as examples that illustrate the wide range of systems and applications that may become clear to those skilled in the art. The scope of the present invention includes the various combinations, subcombinations and permutations of the elements disclosed herein either expressly or through incorporation. No element shall be deemed critical or required unless specified as being a universally necessary element.

Each reference cited herein is expressly incorporated herein in its entirety, for its respective descriptions and teachings.

What is claimed is:

1. An integrated circuit system for quantum computing, comprising:
   a substrate having at least one surface;
   a kinetic inductance layer over the at least one surface of the substrate having a kinetic inductance of at least 5 pH/square;
   a plurality of stacked planarized superconducting layers and intervening insulating layers, over the at least one surface of the substrate, formed into a plurality of Josephson junctions, at least one Josephson junction having a critical current of less than 100 $\mu A/\mu m^2$, at least one Josephson junction having a bias dependent on the kinetic inductance layer; and a resistive layer over the at least one surface of the substrate, that remains non-superconducting at a temperature below 1 K, patterned into damping elements to damp the plurality of Josephson junctions.

2. The integrated circuit system according to claim 1, wherein the kinetic inductance layer has a kinetic inductance of at least 8 pH/square.

3. The integrated circuit system according to claim 1, wherein the plurality of Josephson junctions each have a critical current of less than 50 $\mu A/\mu m^2$.

4. The integrated circuit system according to claim 1, wherein the intervening insulating layers comprise a nitride.

5. The integrated circuit system according to claim 1, further comprising at least one bump bond comprising indium.

6. The integrated circuit system according to claim 1, further comprising at least one bump bond comprising a micron-scale copper post and indium adhesive bond.

7. The integrated circuit system according to claim 1, further comprising deuterium diffused into the Josephson junction.

8. The integrated circuit system according to claim 1, further comprising at least one hydrogen diffusion stop layer.

9. The integrated circuit system according to claim 1, further comprising a second substrate, the substrate and the second substrate being bonded together in alignment.

10. The integrated circuit system according to claim 9, wherein the second substrate comprises a plurality of superconducting qubits, and at least one of the qubits is electromagnetically coupled to a superconducting circuit comprising at least one of the plurality of Josephson junctions.

11. The integrated circuit system according to claim 9, wherein the substrate and the second substrate have protruding posts and corresponding trenches, wherein the protruding posts and corresponding trenches assure alignment of the substrate and the second substrate.

12. A method of forming an integrated circuit system for quantum computing, comprising:
providing a substrate having a surface;
forming a kinetic inductance layer having a kinetic inductance of at least 5 pH/square over the surface of the substrate;
depositing a plurality of stacked superconducting layers and intervening insulating layers over the kinetic inductance layer;
patterning the plurality of superconducting layers and intervening insulating layers into Josephson junctions, at least one Josephson junction having a critical current of less than 100 $\mu A/\mu m^2$;
planarizing the patterned plurality of superconducting layers and intervening insulating layers; and forming a resistive layer that remains non-superconducting at a temperature below 1 K over the planarized patterned plurality of superconducting layers, patterned to damp the Josephson junctions.

13. The method according to claim 12, wherein the substrate comprises a silicon substrate, and the intervening insulating layers comprise silicon nitride.

14. The method according to claim 12, wherein the kinetic inductance layer has a kinetic inductance of at least 8 pH/square.

15. The method according to claim 12, wherein the Josephson junctions have a critical current of less than 50 $\mu A/\mu m^2$.

16. The method according to claim 12, further comprising bonding the substrate using at least one bump bond comprising indium.

17. The method according to claim 12, further comprising bonding the substrate using at least one bump bond comprising a micron-scale copper post and an indium adhesive bond.

18. The method according to claim 12, further comprising diffusing deuterium into the Josephson junction.

19. The method according to claim 12, further comprising forming at least one hydrogen diffusion stop layer over the substrate.

20. An integrated circuit system for quantum computing, comprising:
a substrate which is non-superconducting at a temperature below 1 K;
a patterned kinetic inductance layer, formed over the substrate, having a kinetic inductance of at least 5 pH/square;
a plurality of stacked planarized superconducting layers and intervening insulating layers, formed over the kinetic inductance layer, and patterned into a plurality of Josephson junctions, at least one Josephson junction having a critical current of less than 100 $\mu A/\mu m^2$; and
a patterned resistive layer, that remains non-superconducting at a temperature below 1 K, formed over the plurality of stacked planarized superconducting layers and intervening insulating layers, and having a pattern to form Josephson junction damping elements for damping the plurality of Josephson junctions.

21. The integrated circuit according to claim 20, wherein:
the substrate comprises a silicon substrate;
the superconducting layers comprise niobium and are superconducting at 1 K;
the intervening insulating layers comprise silicon nitride; and
the kinetic inductance layer comprises niobium nitride.

* * * * *